(12) United States Patent
Williamson et al.

(10) Patent No.: US 7,948,060 B2
(45) Date of Patent: May 24, 2011

(54) INTEGRATED CIRCUIT STRUCTURE

(75) Inventors: Ken Williamson, Northumberland (GB);
Michael David May, Bristol (GB);
Simon Christopher Dequin Clemow,
Bristol (GB)

(73) Assignee: XMOS Limited, London (GB)

( * ) Notice: Subject to any disclaimer, the term of this patent is extended or adjusted under 35 U.S.C. 154(b) by 356 days.

(21) Appl. No.: 12/165,776

(22) Filed: Jul. 1, 2008

(65) Prior Publication Data
US 2010/0001405 A1    Jan. 7, 2010

(51) Int. Cl.
*H01L 23/544* (2006.01)
(52) U.S. Cl. ........... 257/620; 257/E23.135; 257/619; 257/750; 257/758; 438/113; 438/458; 438/462
(58) Field of Classification Search .......... 257/E21.495, 257/E23.01, E23.135, 619, 620, 747, 750, 257/758, 763, 774, 786, 797; 438/107, 113, 438/149, 458, 459, 462, 637
See application file for complete search history.

(56) References Cited

U.S. PATENT DOCUMENTS

| | | | |
|---|---|---|---|
| 5,831,330 A * | 11/1998 | Chang | 257/620 |
| 5,834,829 A * | 11/1998 | Dinkel et al. | 257/620 |
| 6,022,791 A * | 2/2000 | Cook et al. | 438/458 |
| 6,399,897 B1 * | 6/2002 | Umematsu et al. | 174/261 |
| 6,441,465 B2 * | 8/2002 | Lin et al. | 257/620 |
| 6,492,716 B1 * | 12/2002 | Bothra et al. | 257/678 |
| 6,537,849 B1 * | 3/2003 | Tsai et al. | 438/106 |
| 6,605,861 B2 * | 8/2003 | Toyoda | 257/620 |
| 6,841,455 B2 * | 1/2005 | West et al. | 438/462 |
| 6,861,754 B2 | 3/2005 | Lin et al. | |
| 6,998,712 B2 * | 2/2006 | Okada et al. | 257/758 |
| 7,129,566 B2 * | 10/2006 | Uehling et al. | 257/620 |
| 7,161,806 B2 * | 1/2007 | Yanase et al. | 361/707 |
| 7,169,699 B2 * | 1/2007 | Takada | 438/622 |
| 7,190,824 B2 * | 3/2007 | Chen | 382/151 |
| 7,453,128 B2 * | 11/2008 | Tsutsue et al. | 257/409 |
| 7,667,302 B1 * | 2/2010 | Chang et al. | 257/659 |
| 7,675,175 B2 * | 3/2010 | Tokitoh et al. | 257/758 |
| 7,741,715 B2 * | 6/2010 | Kim et al. | 257/758 |
| 7,812,424 B2 * | 10/2010 | Barth et al. | 257/532 |

(Continued)

FOREIGN PATENT DOCUMENTS

JP        09246387 A        9/1997

(Continued)

OTHER PUBLICATIONS

European Search Report and Written Opinion corresponding to International Application No. PCT/EP2009/058206, dated Oct. 5, 2009.

*Primary Examiner* — Chris Chu
(74) *Attorney, Agent, or Firm* — Sughrue Mion, PLLC (57) ABSTRACT

An integrated circuit and corresponding method of manufacture. The integrated circuit has a die comprising: an outer strengthening ring around a periphery of the die, the outer ring having one or more gaps; and an inner strengthening ring within the outer ring and around interior circuitry of the die, the inner ring having one or more gaps offset from the gaps of the outer ring. One or more conducting members are electrically isolated from said rings and electrically connected to the interior circuitry, each member passing through a gap of the inner ring and through a gap of the outer ring.

21 Claims, 9 Drawing Sheets

Metal 0

U.S. PATENT DOCUMENTS

| | | | |
|---|---|---|---|
| 2002/0024115 A1* | 2/2002 | Ibnabdeljalil et al. | 257/620 |
| 2002/0145196 A1 | 10/2002 | Wang | |
| 2002/0167071 A1* | 11/2002 | Wang | 257/620 |
| 2005/0087878 A1* | 4/2005 | Uesugi et al. | 257/758 |
| 2005/0151239 A1 | 7/2005 | Lee | |
| 2006/0076651 A1* | 4/2006 | Tsutsue | 257/620 |
| 2006/0081971 A1 | 4/2006 | Shau | |
| 2006/0102980 A1* | 5/2006 | Nakashiba | 257/508 |
| 2006/0267454 A1 | 11/2006 | Pitts | |
| 2007/0102792 A1* | 5/2007 | Wu | 257/620 |
| 2008/0179710 A1* | 7/2008 | Yip et al. | 257/620 |
| 2009/0127666 A1* | 5/2009 | Watanabe et al. | 257/620 |
| 2009/0140391 A1* | 6/2009 | Hou et al. | 257/620 |
| 2010/0123219 A1* | 5/2010 | Chen et al. | 257/620 |

FOREIGN PATENT DOCUMENTS

| | | |
|---|---|---|
| JP | 2003203913 A | 7/2003 |

* cited by examiner

Fig. 3 b
Via - 1

Fig. 3 a
Metal - 1

Fig. 3 d
Via 0

Fig. 3 c
Metal 0

INTEGRATED CIRCUIT STRUCTURE

FIELD OF THE INVENTION

The present invention relates to the forming of strengthening rings in the manufacture of integrated circuits.

BACKGROUND

As will be familiar to a person skilled in the art, semiconductor devices are conventionally packaged into the form of integrated circuits (an integrated circuit may also be referred to as an IC or "chip"). As shown schematically in FIG. 1A, an integrated circuit is a package comprising: a die 2 in which electronic components are formed, and surrounding packaging 1 including external pins 4 for connecting the die 2 to the external environment.

Figure 1A:
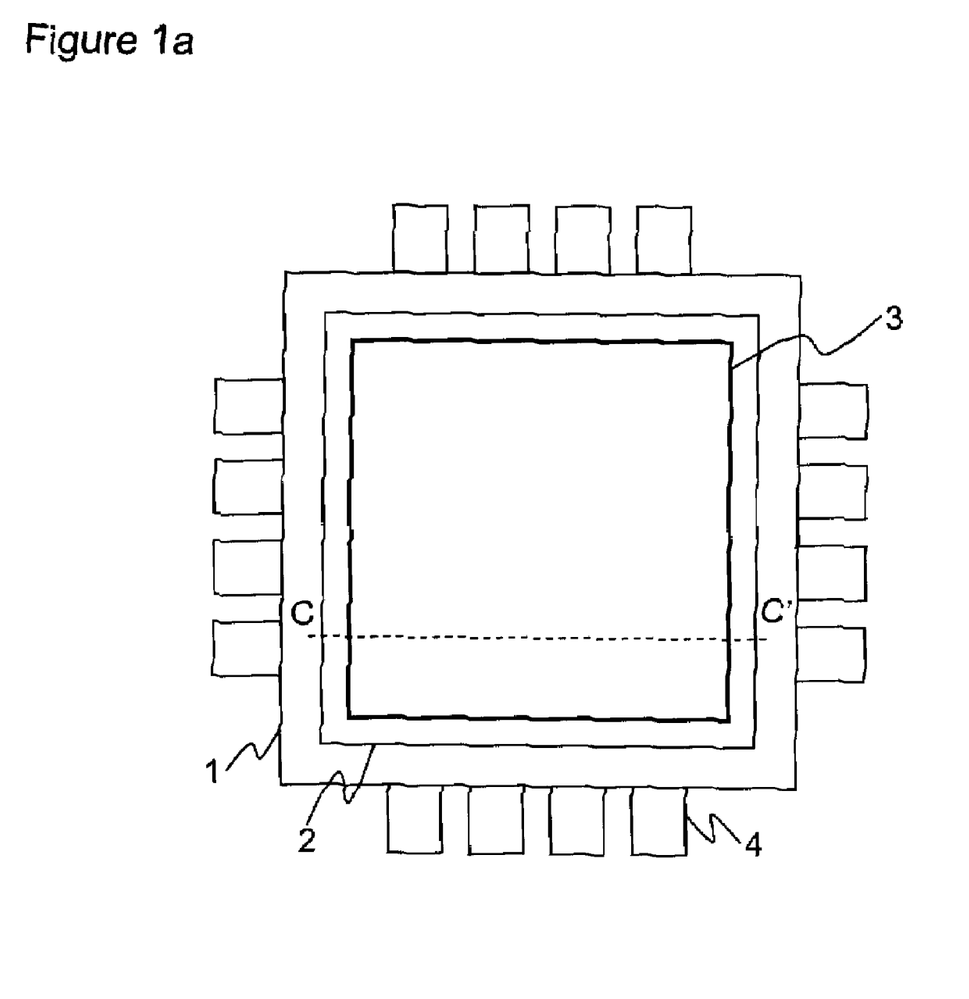
FIG. 1A is a plan view of an integrated circuit package.
Figure 1B:
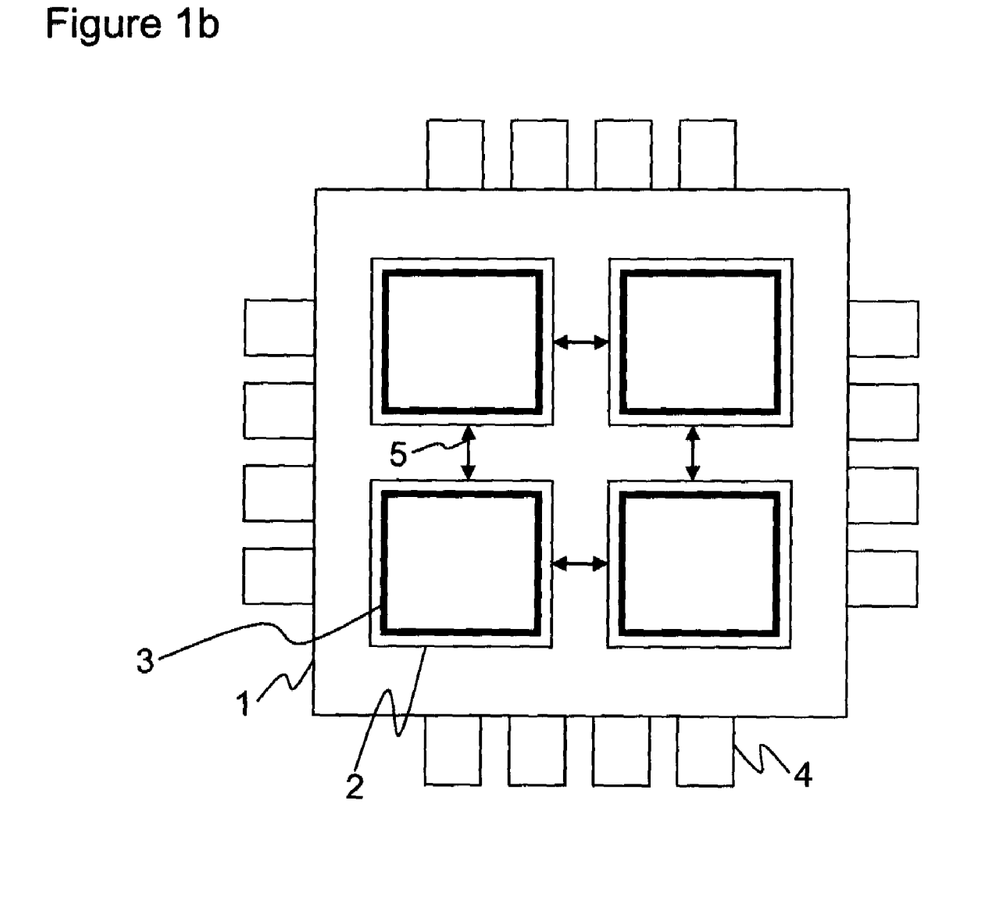
FIG. 1B is a plan view of another integrated circuit package.

In some applications, as shown schematically in FIG. 1B, a plurality of dies 2 may be packaged onto the same chip and electrically connected to one another by conducting connections 5. An example of this is a multi-core processor, wherein a plurality of processors are each formed on a respective die 2, and packaged together on the same chip in an interconnected array or other arrangement so as to be able to communicate signals with one another via the connections 5.

However, due to certain packaging requirements, the need to provide conducting connections 5 between the multiple dies 2 can lead to additional and expensive manufacturing processing, increased chip size, and a more a complicated assembly process. Particularly, most dies 2 have a metal strengthening ring 3 formed close to their outer perimeter, sometimes referred to a "seal ring". The need to arrange this ring 3 together with the interconnections 5, and ensure they are electrically isolated from one another, leads to these packaging issues. Similar packaging issues can be caused due to the connections between the die 2 and the pins 4, or connections between the die 2 and other components packaged on the same chip.

The seal ring 3 is now discussed in more detail. The structure of an integrated circuit is vulnerable to mechanical damage. For example, damage in the form of cracking can occur due to stresses during the wafer dicing process whereby the die is cut from a larger wafer comprising multiple dies formed on the same piece of silicon. Stresses can also occur due to thermal effects during the manufacturing process, or mechanical effects in the packaging, mounting or other processes, again potentially causing damage. Further, the structure may also be vulnerable to environmental damage such as damage due to impact or abrasion, chemical damage due to corrosion, and electrical damage due to static electricity (ESD).

Such cracking or other damage can lead to reliability issues. For example, cracking can lead to the ingress of moisture or other contamination, which reduces reliability of the chip.

In order to mitigate such issues, many ICs are manufactured having a strengthening ring 3 such as a seal ring. The seal ring 3 is formed in the die 2 around the outermost edge, and its primary role is to stop cracking of the chip. Any cracks that are created, e.g. during dicing, will follow a straight line and will be terminated and contained upon reaching the seal ring 3 at the outer edge of the die 2.

Figure 1C:
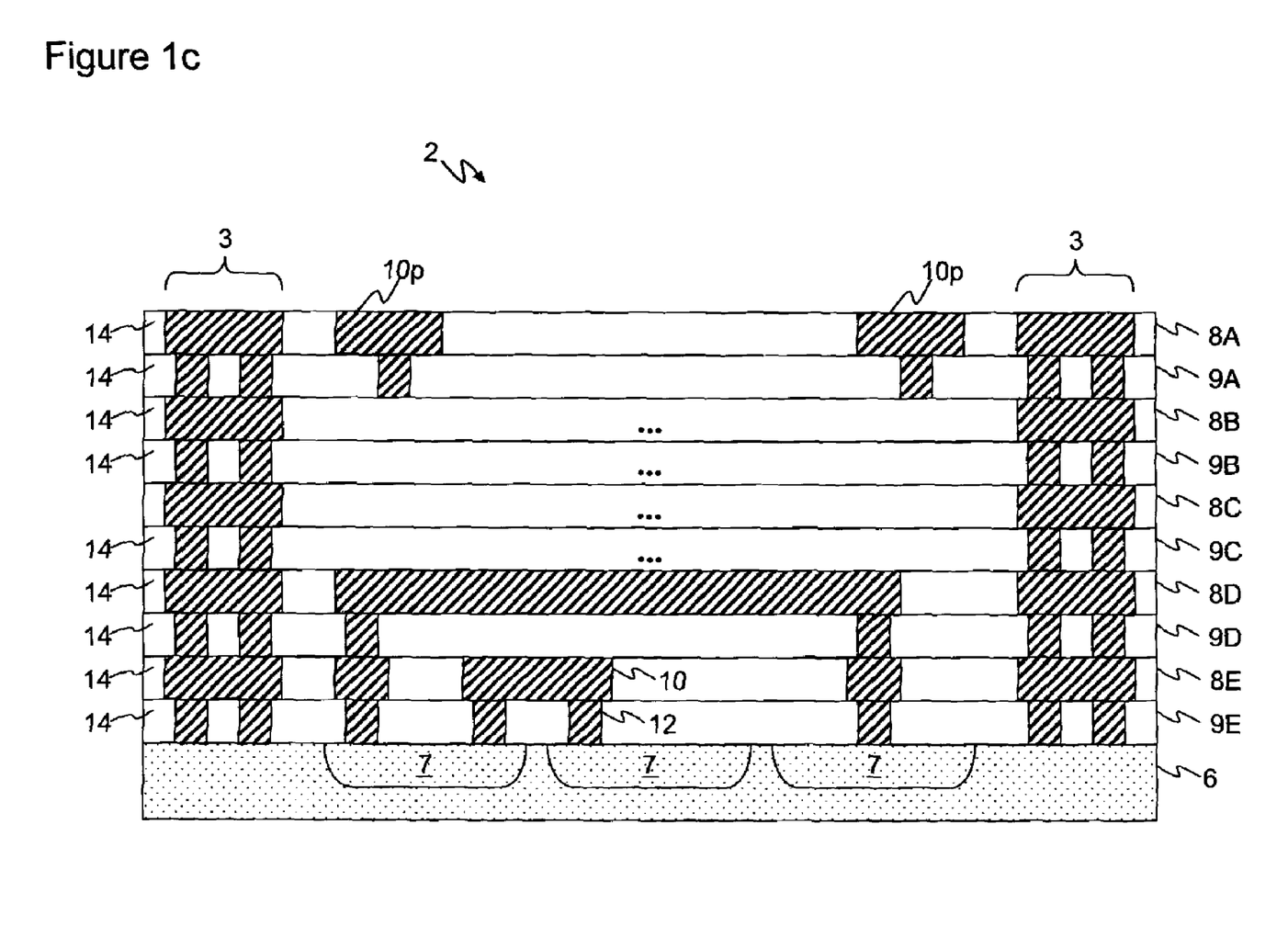
FIG. 1C is a side view of an integrated circuit die.

FIG. 1C shows a cross-sectional side view of the die 2 taken through the line C-C' of FIG. 1A (it will be understood that similar dies 2 can be used in the multi-die package of FIG. 1B). The die 2 comprises a silicon substrate 6 in which p-n junction devices 7 are formed. A plurality of layers is laid over the substrate 6, comprising a plurality of alternate via layers 9 and interconnect layers 8 laid over one another. Each of these layers 8 and 9 comprises a layer of insulating dielectric material, in which are formed conducting interconnects 10 in the interconnect layers 8 and conducting vias 12 in the via layers 9. In accordance with the terminology used in the art, the interconnect layers 8 may be referred to as metal layers (although note that the vias 12 may also be made of metal).

The interconnects 10 form a network of conducting lines or runners in the horizontal plane (relative to the substrate); with the vias 12 providing vertical conducting connections between metal layers 8, as well as between the bottom-most metal layer 8E and the devices 7 of the substrate 6. The via layers 9 insulate the interconnects 10 of the different metal layers 8 from one another, except where it is desired that they should connect, at which points the vertical vias 12 are formed. The interconnects 10 and vias 12 together form electrical connections between the semiconductor devices 7, and may also be used to form other components such as capacitors or inductors, thus creating a functional electronic circuit. Some connections are shown in layers 8E, 9E, 8D and 9D of FIG. 1C, but it will of course be understood that connections may also be formed in other layers, that connections in the metal layers 8 may also be formed in the direction into the page, that a different number of layers may be provided, and generally that the diagram is a simplified, schematic example for illustrative purposes only. Some of the conductors $10p$ formed in the top-most metal layer 8A are used to connect to bond pads, to which are bonded wires connecting the circuit to the external pins 4 or connections 5 to other dies 2 on the same chip. Other packaging techniques could also be used, such as Flip Chip packaging whereby pads are formed on the bottom of the die.

The same layers 8 and 9 used to form electrical connections are also used to form the seal ring 3, by forming horizontally aligned layers of the ring from metal in both the metal layers 8 and via layers 9. Although the seal ring 3 is typically only a mechanical structure and does not form part of the electronic circuit, it can advantageously be formed at the same time as the electrical connections of the circuit as part of the same fabrication process. That is, from the point of view of the fabrication process there is no difference between the seal ring 3 and the electrical connections of the layers 8 and 9: the circuit designer simply patterns the seal ring 2 in the same manner as the electrical connections, so that it is etched and deposited by the fabrication equipment along with the electrical connections in the same manner. Thus the seal ring 3 can be included with minimal modification to the fabrication process.

A more detailed example of a seal ring structure can be found for example in U.S. Pat. No. 6,861,754 (Lin et al). Lin teaches that structural integrity is a particular issue in chips having low-k dielectrics and discloses a seal ring structure particularly suited for such chips.

It would be advantageous to be able to fabricate and package the seal ring 3 together with off-die connections such as 5 in a more efficient manner, in order to reduce the cost, size and/or manufacturing complexity of the chip.

SUMMARY

Whilst a strengthening ring such as seal ring may be a structural necessity, and whilst it may be formed with minimal modification to the fabrication process, in previous arrangements such as that of Lin it has nonetheless been restrictive of integrated circuit design. Particularly, in such circuits, a connection passing out of the die has had to pass through the upper layers and over the top of the seal ring. Instead, it would be advantageous to be able to pass the conductor out of the side of the die. This would allow the number of pads such as 10$p$ to be reduced (or even eliminated), which will reduce the package size and also reduce costs since it costs more to connect via a pad. It will also allow greater flexibility in the design of the die's interconnect layout.

However, there is a difficulty with this in that simply passing a conductor directly through a hole in the ring would reduce its mechanical strength and resistance to environmental damage. There is therefore a need to provide a structure in which a conducting member can be passed through the ring whilst maintaining sufficient structural integrity.

The present invention provides a method for passing conductors through a seal ring, while maintaining suitable characteristics to perform the desired role of a seal ring. The present invention also provides a corresponding structure.

According to one aspect of the invention, there is provided an integrated circuit comprising a die, the die comprising: an outer strengthening ring around a periphery of the die, the outer ring having one or more gaps; an inner strengthening ring within the outer ring and around interior circuitry of the die, the inner ring having one or more gaps offset from the gaps of the outer ring; and one or more conducting members electrically isolated from said rings and electrically connected to the interior circuitry, each passing through a gap of the inner ring and through a gap of the outer ring.

By providing a structure in which a conductor is passed through offset gaps in inner and outer rings, this advantageously allows the conductor to pass through those gaps in the rings whilst maintaining the mechanical strength of the structure.

In a preferred embodiment, portions of the inner ring may overlap with portions of the outer ring. Further, the gaps may be offset such that no part of the gaps of the inner ring overlaps with any part of the gaps of the outer ring, so that the inner and outer rings together provide a substantially continuous ring. Further, the inner and outer rings may be substantially different thicknesses. The inner ring may be thicker than outer ring.

Each of these features, either individually or preferably in combination, has been found to help maintain the mechanical strength of the structure whilst still allowing conductors to be passed through.

The integrated circuit may comprise a semiconductor substrate and a plurality of layers laid over the substrate, the inner and outer seal rings being formed from a plurality of stacked conductors in said layers. The plurality of layers may comprise alternate interconnect layers and via layers, the interconnect layers comprising horizontal conducting interconnects and the via layers comprising vertical conducting vias, the interconnects and vias forming said interior circuitry. The one or more conducting members may be formed in one or more of said interconnect layers.

This advantageously allows the conducting members to be formed at the same time as the interconnects in an interconnect layer, as part of the same fabrication step.

One or more of the gaps in one or both of the rings may be formed by: a continuous portion in a first of said layers, overlaid by a discontinuous portion in a second of said layers adjacent the first layer, overlaid by a discontinuous portion in a third of said layers adjacent the second layer, overlaid by a discontinuous portion in a fourth of said layers adjacent the third layer, overlaid by a continuous portion in a fifth of said layers adjacent the fourth layer, such that the gap is formed by the discontinuities in the second, third and fourth layers and bounded by the continuous portions in the first and fifth layers; and the conducting line may be formed through the discontinuity in the third layer. The first, third and fifth layers may be interconnect layers, and the second and fourth layers may be via layers.

Again, this embodiment has been found to be particularly effective in maintaining the mechanical strength of the structure whilst still allowing conductors to be passed through.

In one application of the present invention, one or more of the conducting members may be a connection between an external pin of the integrated circuit and the interior circuitry of the die.

In another application of the present invention, one or more of the conducting members may be a connection between the interior circuitry of the die and another component packaged in the same integrated circuit. The inner and outer rings may be formed in a first die, and one or more of the conducting members may be a connection between the interior circuitry of the first die and circuitry of another die packaged in the same integrated circuit.

The integrated circuit may comprise a processor. The interior circuitry of the first die may comprise a first processor and the circuitry of the other die may comprises another processor.

One or more of the conducting lines may be arranged to carry an electronic signal through the rings. The electronic signal may be a digital or analogue signal. One or more of the conducting members may be arranged to connect the interior circuitry to one of a ground connection and power supply connection.

The above have been found to be particularly useful applications of the present invention.

Particularly, passing conductors through the side of the die simplifies the assembly process, such that little or no extra work is required to create a multi-die chip such as a multi-core processor.

In further embodiments, the integrated circuit may comprise an electrical isolation device connected to one or more of the conducting members, operable to selectively disconnect the electrical connection formed by that conducting member between the interior circuitry and the exterior of the outer ring. The electrical isolation device may comprise a laser fuse formed on said die.

These embodiments are particularly advantageous, since they allow for protection against electrostatic damage (ESD), against "latch-up" (an unintended, parasitic low-impedance path which causes a short circuit), and/or against other circuit damage which may occur due to the connecting paths created by the conducting members 40. Such problems could occur as part of the sawing process, packaging process or during device usage.

According to another aspect of the present invention, there is provided a method of manufacturing an integrated circuit comprising a die, the method comprising: around a periphery of the die, forming an outer strengthening ring having one or more gaps; within the outer ring and around interior circuitry of the die, forming an inner strengthening ring having one or more gaps offset from the gaps of the outer ring; and forming one or more conducting lines electrically isolated from said rings and electrically connected to the interior circuitry, each being passed through a gap of the inner ring and through a gap of the outer ring.

BRIEF DESCRIPTION OF THE DRAWINGS

For a better understanding of the present invention and to show how it may be carried into effect, reference will now be made by way of example to the accompanying drawings in which:

FIG. 3b is a plan view of part of a via layer of the IC of FIG. 3a,

FIG. 3e is a plan view of part of the next metal layer of the IC of FIGS. 3a-3d.

DETAILED DESCRIPTION OF PREFERRED EMBODIMENTS

In the manufacture of a semiconductor device, it may be desirable for conductive channels to be presented out of the boundaries of the seal ring. Therefore, as mentioned, it would be desirable to be able to pass conductors through a seal ring whilst maintaining mechanical rigidity and functionality of the seal ring structure. The following describes an example of a seal ring structure formed by patterning multiple layers comprising insulating dielectric layers with conductive vias covered with conducting interconnect layers such as metal layers. Discontinuities are made in the seal ring structure encapsulating a circuit at certain layers. These discontinuities allow conductors to traverse the seal ring, while maintaining mechanical strength. The conductors pass through the seal rings into the scribe lane.

Figure 2A:
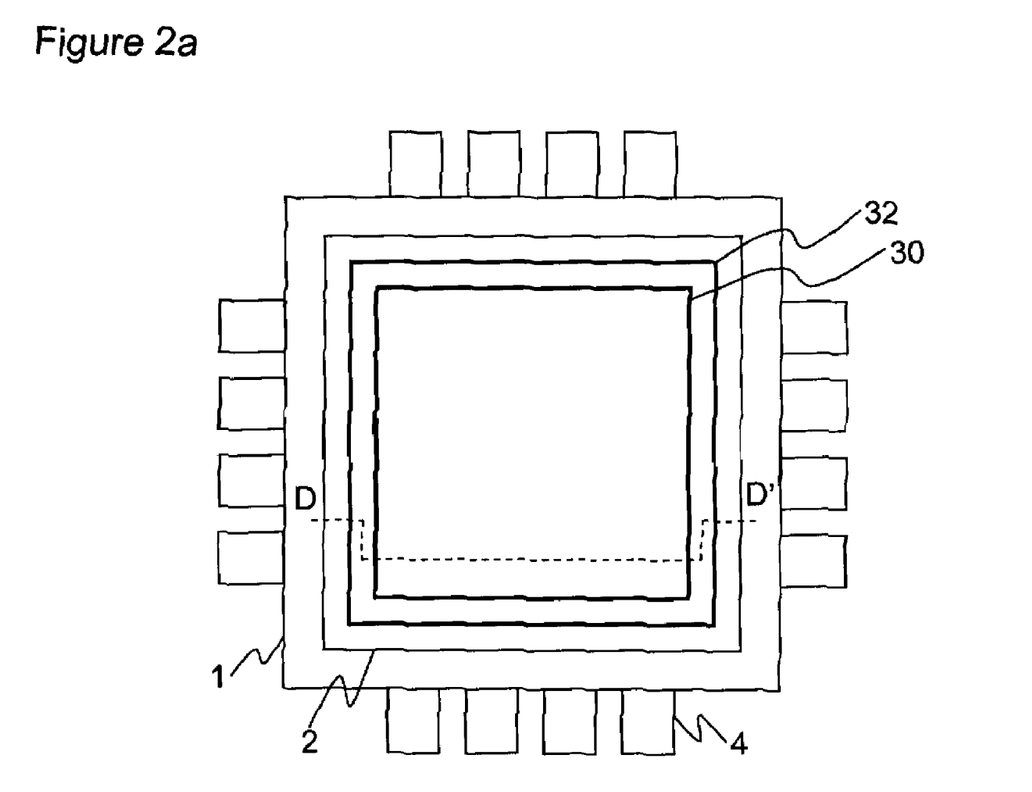
FIG. 2A is a plan view of an integrated circuit package.

FIG. 2A shows schematically an integrated circuit according to embodiments of the present invention. As in FIG. 1A, the IC is a package comprising: a die 2 in which electronic components are formed, and surrounding packaging 1 including external pins 4 for connecting the die 2 to the external environment. However, the die 2 of FIG. 2A comprises both an inner seal ring 30 and an outer seal ring 32. Both the inner and outer seal rings 30 and 32 are formed substantially around the perimeter of the die 2 close to its outermost edge. The outer seal ring 32 substantially surrounds the inner seal ring 30, and the inner seal ring 30 substantially surrounds the electrical connections formed in rest of the die 2.

Figure 2B:
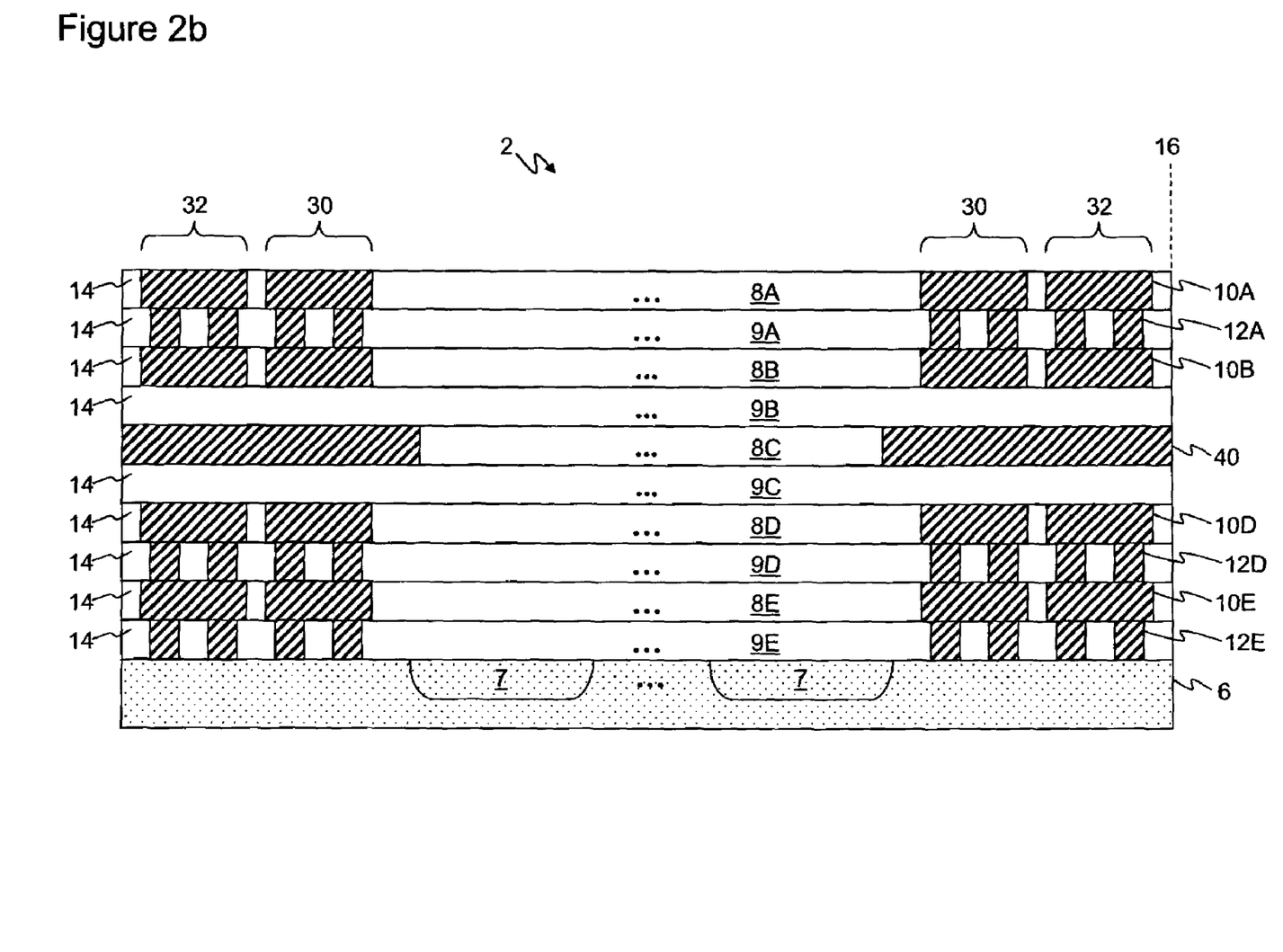
FIG. 2B is a side view of an integrated circuit die.

FIG. 2B shows a cross-sectional side view of the die 2 taken through the line D-D' of FIG. 2A (and it will be understood that similar dies 2 can be used in a multi-die package such as that of FIG. 1B). Again, the die 2 comprises a silicon substrate 6 in which p-n junction devices 7 are formed. A Plurality of layers is laid over the substrate 6, comprising a plurality of alternate via layers 9 and metal layers 8 laid over one another. As in FIG. 1B, each of these layers 8 and 9 comprises a layer of insulating dielectric material, in which are formed conducting interconnects in the metal layers 8 and conducting vias in the via layers 9. The interconnects form a network of conducting lines or runners in the horizontal plane (relative to the substrate); with the vias providing vertical connections between metal layers 9, as well as between the bottom-most metal layer 8E and the devices 7 of the substrate 6. Also as in FIG. 1B, the metal interconnects 10 and vias 12 together form electrical connections between the semiconductor devices 7, and may also be used to form other components such as capacitors or inductors, thus creating a functional electronic circuit. Such electrical connections are omitted from FIG. 2B, but it will be understood that these will be provided according to whatever arrangement the designer finds suitable for the circuit in question. It will also be understood that the there could be any number of layers 8 and 9 laid over the substrate 6 depending on the particular design.

However, unlike the structure of FIG. 1B, both inner and outer seal rings 30 and 32 are provided substantially around the perimeter of the die 2 close to its outermost edge. As mentioned, the outer seal ring 32 substantially surrounds the inner seal ring 30, and the inner seal ring 30 substantially surrounds the electrical connections formed in rest of the die 2 between the devices 7. The inner and outer seal rings 30 and 32 are formed from portions 10 in the metal layers 8 as part of the same process as forming the electrical interconnects, and from vias 12 in the via layers 9 as part of the same process as forming the vias 12 between the interconnects 10. The inner seal ring 30 and outer seal ring 32 are preferably formed in the same layers as each other such that, as a whole, they are vertically aligned. They are preferably formed in all or most layers from the top to bottom layer.

Further, the inner and outer seal rings 30 and 32 are formed having gaps allowing a conducting line 40 to be passed through. Note that the line D-D' in FIG. 2A shifts horizontally between the inner and outer seal rings 30 and 32, so that the gaps of the inner seal ring 30 in FIG. 2B are horizontally offset from the gaps of the outer seal ring 32. In the embodiment shown, the gaps are vertically aligned. Apart from these gaps, the seal rings are preferably formed substantially around the full perimeter of the die 2.

One or more gaps may be provided in each of the inner and outer seal rings 30 and 32, for passing through one or more conductors 40. Preferably a plurality of gaps are provided in each of the inner and outer seal rings 30 and 32, with a respective pair of an inner and outer gap being provided to pass through each of a plurality of conductors 40. The conductors 40 may be for passing electronic signals such as digital or analogue signals to and/or from the interior circuit of the die 2, and/or for providing connections to a power supply and/or ground.

This structure advantageously allows the circuitry of the die 2 to be connected to one or more external pins 4 by one or more conductors 40 through the side of the seal rings 30 and 32, instead of or in addition to connections passed over the top of the seal ring such as by connections 10p in FIG. 1B. Alternatively or additionally, one or more conductors 40 through the seal rings 30 and 32 can be used to connect the interior circuitry of the die 2 to another die or other component packaged on the same chip, again instead of or in addition to connections over the top of the seal ring. For example, where the die 2 comprises a processor, the side connections 40 could be used to interconnect a multi-core arrangement of two or more similar processors formed on other dies but packaged into the same IC. An example of a suitable processor for this would be the Xcore, made by XMOS Ltd.

Such a side-connecting structure provides more flexibility in the overall layout design of the IC. For example it may allow a larger number of connections to the die 2, a more efficient layout in terms of space, and/or a less awkward or difficult design. Further, if no connections are made over the top of the seal ring, this will advantageously result in a slimmer packaging.

To construct the conductors 40, it is preferable to change the configuration of a number of layers. The seal rings are preferably formed by stacking interconnected metal layers along the perimeter of the die 2. The conductors 40 are fed through the gap between the offset inner and outer seal rings 30 and 32 whilst structures of interconnected metal layers are added above and below to provide mechanical strength.

The layer-by-layer make-up of a preferred structure is now discussed in more detail with reference to the plan views of FIGS. 3a-3e, beginning at layer 8D in FIG. 3a, which shows how the metal layer below the metal layer that will traverse the seal rings may look. At metal layer 8D, the inner seal ring 30 is formed as a substantially continuous metal portion 10C of that metal layer. Similarly, the outer ring 32 is formed as a substantially continuous metal portion of that metal layer. The inner and outer seal rings 30 and 32 are separated by a portion of the surrounding insulating dielectric 14 in which the metal layers are formed. The outer ring 32 is formed close to the edge of the die 16, beyond which is the scribe lane 20 (the line around the die 2 where it is sawn from the wafer).

Figure 3:
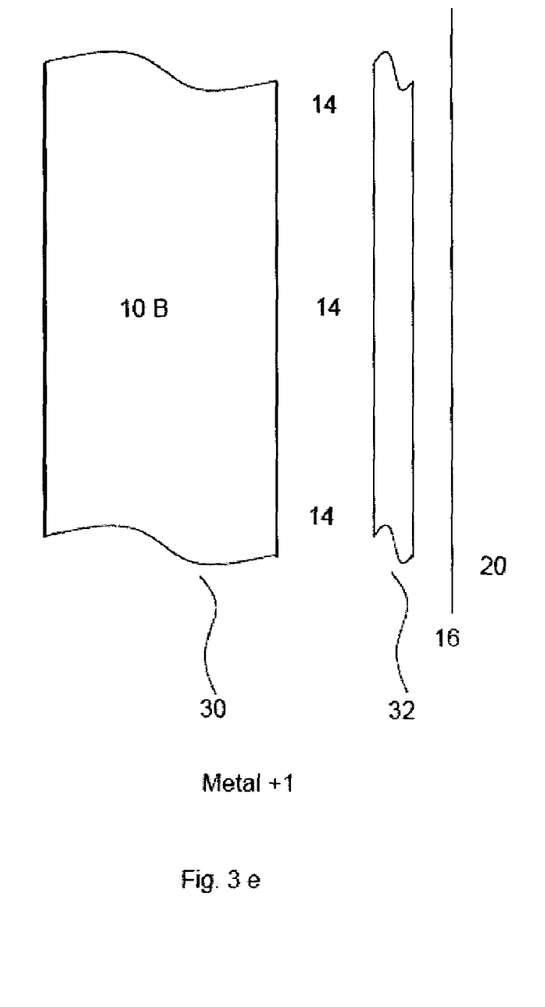
Figure 3A:
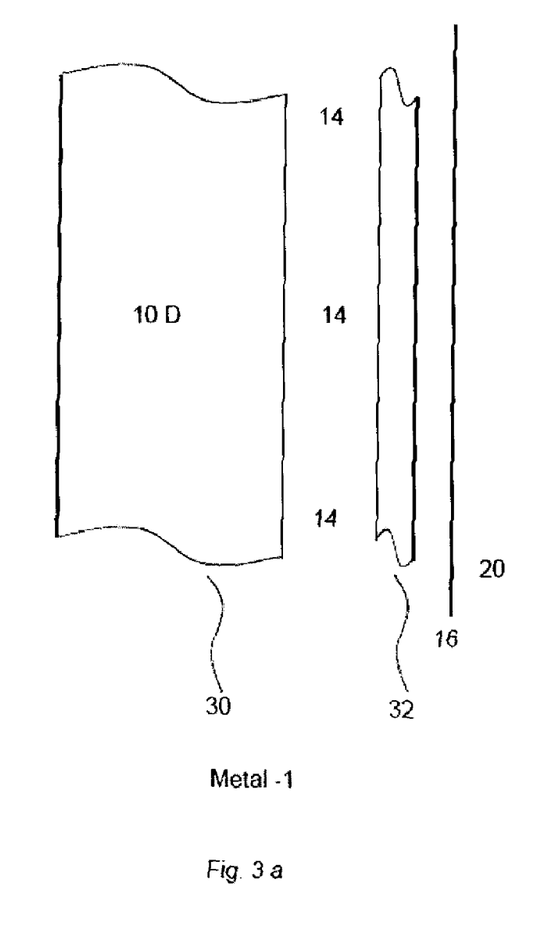
FIG. 3a is a plan view of part of a metal layer of a die.
Figure 3B:
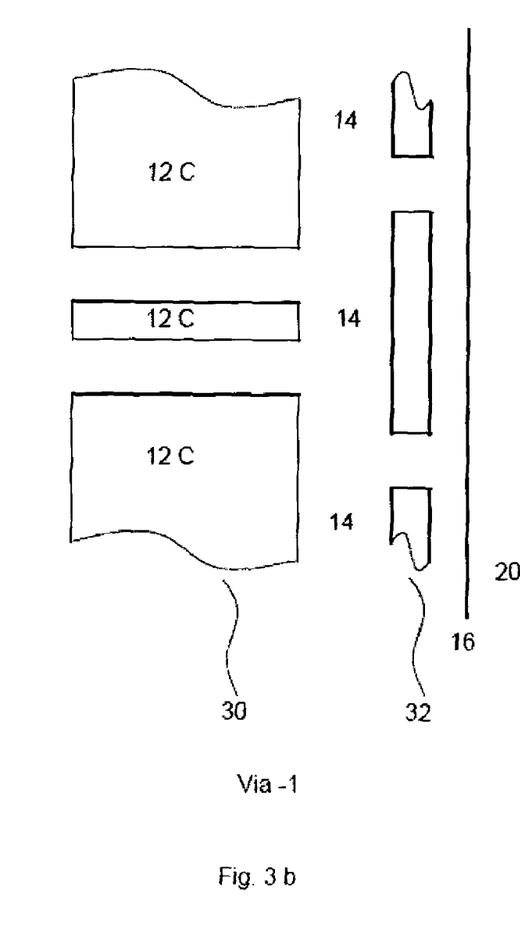

At via layer 9C shown in FIG. 3b, which is laid over metal layer 8D, the inner seal ring 30 is then formed as discontinuous metal portions 12C of that via layer. Similarly, the outer seal ring 32 is formed as discontinuous metal portions of that via layer. The discontinuities, i.e. the gaps, of the inner and outer seal rings 30 and 32 are horizontally displaced or offset from one another. That is, the gaps of the inner seal ring 30 are offset from those of the outer seal ring 32 in the direction around the rings. The gaps comprise further portions of the insulating dielectric 14 in which the vias of the via layers are formed. This is to electrically isolate the surrounding seal ring areas from the conductor 40 to follow.

Figure 3C:
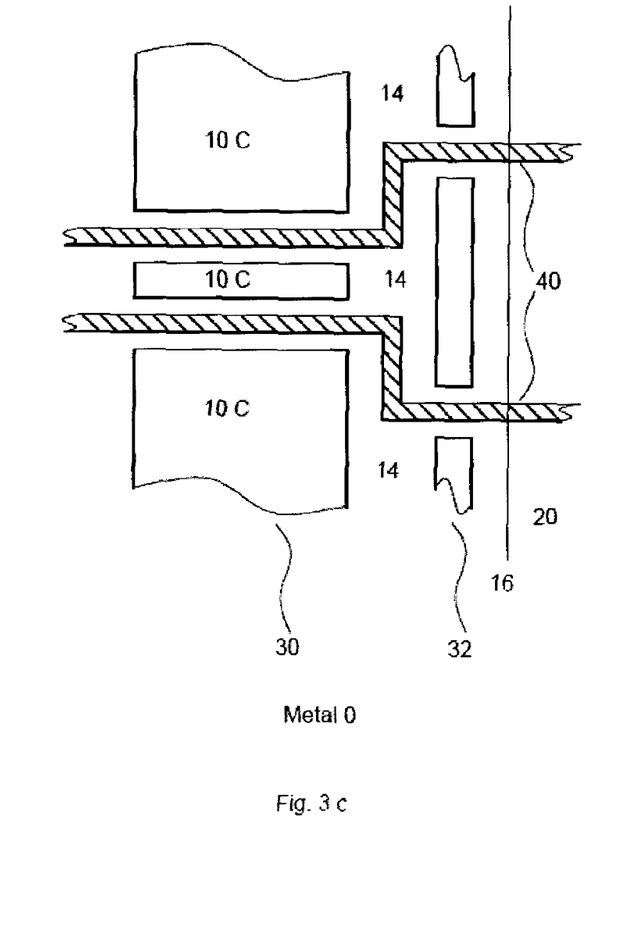
FIG. 3c is a plan view of part of the next metal layer of the IC of FIGS. 3a-3b.

At metal layer 8C shown in FIG. 3c, which is laid over via layer 9C, the inner seal ring 30 is formed as discontinuous metal portions 10C of that metal layer. Similarly, the outer seal ring 32 is formed as discontinuous metal portions of that metal layer. The gaps in those portions of the metal layer 8C are substantially aligned in the horizontal plane with the corresponding gaps in the seal ring portions in the insulating layer 9C below, i.e. the gaps of the inner and outer seal rings 30 and 32 in the metal layer 8C are again horizontally offset from one another in the same manner as the gaps below. Furthermore, the conductors 40 are also formed in the metal layer 8C, each passing through a respective gap in the inner seal ring 30 and a respective gap in the outer seal ring 32. The conductors 40 are electrically isolated from the portions 10C by further portions of the insulating dielectric 14 in which the metal layer 9C is formed.

The conductors 40 are formed at the same time as the parts of the inner and outer seal rings 30 and 32, i.e. are patterned into the metal layer 9C in the same manner, and are etched and disposed into that layer as part of the same fabrication step.

Figure 3D:
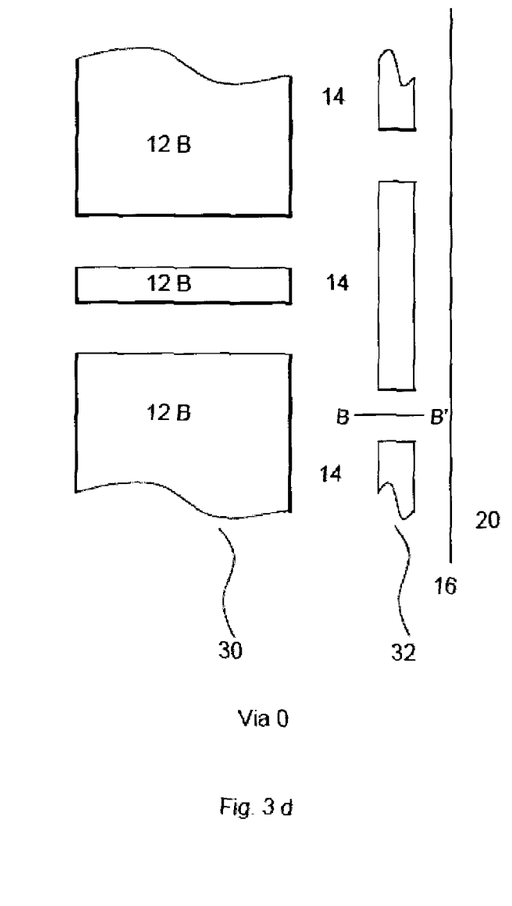
FIG. 3d is a plan view of part of the next via layer of the IC of FIGS. 3a-3c.

At via layer 9B shown in FIG. 3d, which is laid over metal layer 8C, each of the outer seal ring 32 and inner seal ring 30 is then formed in substantially the same shape as the via layer 9D shown in FIG. 3b. That is, the inner seal ring 30 is formed as discontinuous metal portions 12B of the via layer 9B, and similarly the outer seal ring 32 is formed as discontinuous metal portions of that via layer 9B. The gaps in the portions of that via layer 9B are substantially aligned in the horizontal plane with the corresponding gaps in the seal ring portions in the metal layer 8C and via layer 9C below, i.e. the gaps of the inner and outer seal rings 30 and 32 in the via layer 9B are again horizontally offset from one another in the same manner as the gaps below. Again, the gaps comprise further portions of the insulating dielectric 14 in which the vias of the insulating layers are formed. This is to electrically isolate the surrounding seal ring areas from the conductor 40 below.

At metal layer 8B shown in FIG. 3e, which is laid over via layer 9B, the inner seal ring 30 is again formed as a substantially continuous metal portion 10B of that metal layer, and similarly the outer seal ring 32 is formed as a substantially continuous metal portion of that metal layer, in the same shape as the corresponding portions of metal layer 9D.

The inner and outer seal rings 30 and 32 in any layers above metal layer 9B or below metal layer 9D may also be continuous, in the same shape as those of layers 9B and 9D. Alternatively or additionally, some or all of those other layers could be used to form further gap structures above and/or below those described for passing through further conductors 40.

The inner and outer seal ring may be different thicknesses. Preferably, the inner seal ring 30 may be thicker than the outer seal ring 32 (this is shown in FIGS. 3a-3c but not FIG. 2a or 2b). Preferably, portions of the inner seal ring 30 overlap with portions of the outer seal ring 32, i.e. portions that are not gaps overlap (as shown in FIGS. 3b-3d).

Preferably, the gaps are offset such that no part of the gaps of the inner ring overlaps with any part of the gaps of the outer ring (as also shown in FIGS. 3a-3c) such that the rings together project a substantially continuous ring outwards from the die 2, i.e. substantially no gap is "visible" when viewed at a right angle to the direction around the rings, or rather substantially no gap is projected onto a plane tangential to the direction around the rings. This provides a substantially continuous barrier against the propagation of cracks to the edge of the die (substantial in the sense that the chance or effect of any cracking propagating beyond both rings is negligible on a practical manufacturing scale).

Each of the above features, either individually or preferably in combination, has been found to improve the mechanical strength of the structure whilst still allowing conductors to be passed through.

Note also that at the fabrication of each layer, the inner and outer seal rings 30 and 32 are formed at substantially the same time, as well as at the same time as the interior circuit connections 10 or 12 of that layer. That is, they are patterned into that layer in the same manner, and are etched and disposed into that layer as part of the same fabrication step. So when forming metal layer 8D for example, the inner portion 10D of the inner ring 30 is formed at the same time as the outer portion of the outer ring 32 as well as interior circuit interconnects 10; and when subsequently forming via layer 9C, the inner portion 12C of the inner ring 30 is formed at the same time as the outer portion of the outer ring 32 as well as interior circuit vias 12; and so on.

Figure 4:
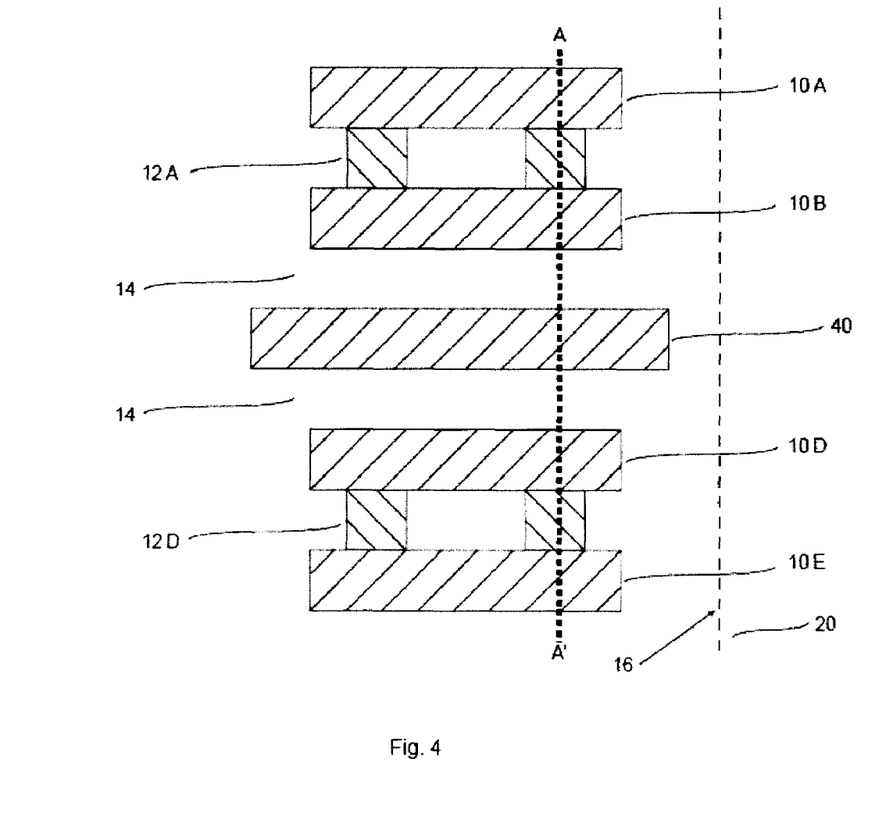
FIG. 4 is a cross section through FIG. 3d.

FIG. 4 shows a cross-sectional side view through line B-B' of FIG. 3d, in a plane rotated ninety degrees about the line B-B' (the same plane as FIG. 2b). Here the construction of the seal ring from vias 12A and 12D and metal layer portions 10A, 10B, 10D and 10E can be seen, as well as how the absence of vias in the gaps between vias 12B and 12C and metal layer portions 10C provides a clear path for the conductive line 40 to traverse the seal ring whilst remaining electrically isolated.

Figure 5:
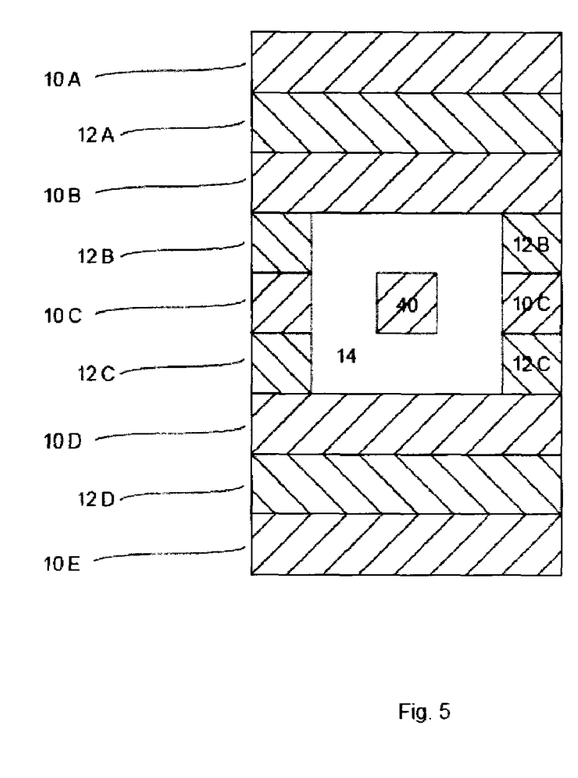
FIG. 5 is a cross section through FIG. 4.

FIG. 5 shows an alternative cross-sectional side view through line A-A' of FIG. 4, in a plane rotated ninety degrees about the line A-A' (at ninety degrees to both FIGS. 3d and 4). This shows, from a different angle, the electrical isolation by the dielectric 14 of the conductor 40, whilst maintaining mechanical strength of the seal ring using vias 12A, 12B, 12C and 12D and metal layer portions 10A, 10B, 10C, 10D and 10E.

In one particularly advantageous embodiment, the integrated circuit may be provided with an electronic isolation device disposed at one or more of the conducting members 40, connected so that the conducting path formed by that conductor through the seal rings 3 between the interior circuitry of the die 2 and its exterior can be selectively disconnected. That is, so the interior circuitry can be electrically isolated from the external environment, external to the outer ring, at least as far as the electrical connection formed by the conductor 40 in question is concerned.

For example, the electrical isolation device could comprise a fuse latch such as a laser fuse. The laser fuse may be formed on the die 2 as part of the fabrication process, and connected between the die's interior circuitry and the conducting member 40. The laser fuse can then be "fused" at a later stage of manufacture by exposing it to a laser beam, breaking the electrical connection between the interior circuitry and the conducting member 40. This "fusing" may also be reversible.

By isolating the conducting members 40 at the appropriate stage, this advantageously allows for protection against electro-static damage (ESD), against "latch-up" (an unintended, parasitic low-impedance path which causes a short circuit), and/or against other circuit damage which may occur due to the connecting paths created by the conducting members 40. This could occur as part of the sawing stage, packaging stage or during device usage.

It will be appreciated that the above embodiments are described only by way of example. For instance, the drawings are schematic and not necessarily to scale (although it is at least intentional in FIGS. 3a-5 to show where different portions of the described embodiments overlap or are offset). Further, by "ring" is not meant an annular ring (although that possibility is not necessarily excluded). Nor need the ring 30 or 32 be continuous around any given layer, nor encompass full perimeter of the die 2. Further, although the above has been described in terms of gaps that are horizontally offset, in the same plane as the substrate 6, alternatively the gaps could be vertically offset, or both horizontally or vertically offset. Further, the inner and outer rings 30 and 32 need not be entirely vertically aligned with one another, nor need the portions of a given ring in different layers be horizontally aligned with one another. Further, one or more of the metal layers could more generally be conductive interconnect layers, comprising a network of horizontal interconnecting conductors or runners which could be of a conducting material other than metal such as polysilicon; and similarly the vias of one or more of the via layers need not be metal, but could more generally be any vertical conductors such as polysilicon. Other applications and configurations may be apparent to the person skilled in the art given the disclosure herein. The scope of the invention is not limited by the described embodiments, but only by the following claims.

The invention claimed is:

1. An integrated circuit comprising a die, the die comprising:
    an outer strengthening ring around a periphery of the die, the outer ring having one or more gaps;
    an inner strengthening ring within the outer ring and around interior circuitry of the die, the inner ring having one or more gaps offset from the gaps of the outer ring; and
    one or more conducting members electrically isolated from said rings and electrically connected to the interior circuitry, each passing through a gap of the inner ring and through a gap of the outer ring.

2. The integrated circuit of claim 1, wherein portions of the inner ring overlap with portions of the outer ring.

3. The integrated circuit of claim 1, wherein the gaps are offset such that no part of the gaps of the inner ring overlaps with any part of the gaps of the outer ring, so that the inner and outer rings together provide a substantially continuous ring.

4. The integrated circuit of claim 1, wherein the inner and outer rings are substantially different thicknesses.

5. The integrated circuit of claim 4, wherein the inner ring is thicker than outer ring.

6. The integrated circuit of claim 1, wherein the integrated circuit comprises a semiconductor substrate and a plurality of layers laid over the substrate, the inner and outer seal rings being formed from a plurality of stacked conductors in said layers.

7. The integrated circuit of claim 6, wherein the plurality of layers comprises alternate interconnect layers and via layers, the interconnect layers comprising horizontal conducting interconnects and the via layers comprising vertical conducting vias, the interconnects and vias forming said interior circuitry.

8. The integrated circuit of claim 7, wherein the one or more conducting members are formed in one or more of said interconnect layers.

9. The integrated circuit of claim 7, wherein the first, third and fifth layers are interconnect layers, and the second and fourth layers are via layers.

10. The integrated circuit of claim 6, wherein one or more of the gaps in one or both of the rings are formed by: a continuous portion in a first of said layers, overlaid by a discontinuous portion in a second of said layers adjacent the first layer, overlaid by a discontinuous portion in a third of said layers adjacent the second layer, overlaid by a discontinuous portion in a fourth of said layers adjacent the third layer, overlaid by a continuous portion in a fifth of said layers adjacent the fourth layer, such that the gap is formed by the discontinuities in the second, third and fourth layers and bounded by the continuous portions in the first and fifth layers; and the conducting line is formed through the discontinuity in the third layer.

11. The integrated circuit of claim 1, wherein one or more of the conducting members is a connection between an external pin of the integrated circuit and the interior circuitry of the die.

12. The integrated circuit of claim 1, wherein one or more of the conducting members is a connection between the interior circuitry of the die and another component packaged in the same integrated circuit.

13. The integrated circuit of claim 1, wherein the inner and outer rings are formed in a first die, and one or more of the conducting members is a connection between the interior circuitry of the first die and circuitry of another die packaged in the same integrated circuit.

14. The integrated circuit of claim 13, wherein the interior circuitry of the first die comprises a first processor and the circuitry of the other die comprises another processor.

15. The integrated circuit of claim 1, wherein the integrated circuit comprises a processor.

16. The integrated circuit of claim 1, wherein one or more of the conducting lines is arranged to carry an electronic signal through the rings.

17. The integrated circuit of claim 16, wherein the electronic signal is a digital signal.

18. The integrated circuit of claim 16, wherein the electronic signal is an analogue signal.

19. The integrated circuit of claim 18, wherein one or more of the conducting members is arranged to connect the interior circuitry to one of a ground connection and power supply connection.

20. The integrated circuit of claim 1, comprising an electrical isolation device connected to one or more of the conducting members, operable to selectively disconnect the electrical connection formed by that conducting member between the interior circuitry and the exterior of the outer ring.

21. The integrated circuit of claim 20, wherein the electrical isolation device comprises a laser fuse formed on said die.

* * * * *